(12) United States Patent
Lee et al.

(10) Patent No.: US 11,139,313 B2
(45) Date of Patent: Oct. 5, 2021

(54) METHOD OF MANUFACTURING SEMICONDUCTOR MEMORY

(71) Applicant: TOKYO ELECTRON LIMITED, Tokyo (JP)

(72) Inventors: Sunghil Lee, Hwaseong-si (KR); Tatsuya Yamaguchi, Nirasaki (JP); Syuji Nozawa, Nirasaki (JP); Nagisa Sato, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/677,066

(22) Filed: Nov. 7, 2019

(65) Prior Publication Data

US 2020/0152656 A1 May 14, 2020

(30) Foreign Application Priority Data

Nov. 14, 2018 (JP) .............................. JP2018-213838

(51) Int. Cl.
| | |
|---|---|
| *H01L 21/336* | (2006.01) |
| *H01L 27/11582* | (2017.01) |
| *H01L 27/1157* | (2017.01) |
| *H01L 27/11556* | (2017.01) |
| *H01L 27/11524* | (2017.01) |

(52) U.S. Cl.
CPC .... *H01L 27/11582* (2013.01); *H01L 27/1157* (2013.01); *H01L 27/11524* (2013.01); *H01L 27/11556* (2013.01)

(58) Field of Classification Search
CPC ......... H01L 27/11582; H01L 27/11524; H01L 27/11556; H01L 27/1157; H01L 27/11529; H01L 27/11551–11556; H01L 27/11578–11582; H01L 27/11514; H01L 27/11597
USPC ........................................................ 438/287
See application file for complete search history.

(56) References Cited

U.S. PATENT DOCUMENTS

| | | | |
|---|---|---|---|
| 9,449,982 B2 | 9/2016 | Lu et al. | |
| 2014/0273373 A1* | 9/2014 | Makala | ................ H01L 21/8221 438/270 |
| 2015/0346561 A1* | 12/2015 | Kim | .................. G02F 1/133345 349/43 |

* cited by examiner

*Primary Examiner* — Calvin Y Choi
(74) *Attorney, Agent, or Firm* — Nath, Goldberg & Meyer; Jerald L. Meyer; Tanya E. Harkins

(57) ABSTRACT

A method of manufacturing a semiconductor memory includes: forming a first lamination on a substrate; forming a first hole through the first lamination; embedding a first sacrificial material including a thermally decomposable organic material in the first hole; forming a recess at an upper portion of the first hole; forming an oxide film in the recess; removing the first sacrificial material under the oxide film; embedding a second sacrificial material on the oxide film in the recess; forming a second lamination on the first lamination and the second sacrificial material; forming a second hole through the second lamination at a position corresponding to the first hole by etching the second lamination in an extension direction of the first hole; and removing the oxide film and the second sacrificial material.

6 Claims, 8 Drawing Sheets

METHOD OF MANUFACTURING SEMICONDUCTOR MEMORY

CROSS-REFERENCE TO RELATED APPLICATION

This application is based upon and claims the benefit of priority from Japanese Patent Application No. 2018-213838, filed on Nov. 14, 2018, the entire contents of which are incorporated herein by reference.

TECHNICAL FIELD

Various aspects and embodiments of the present disclosure relate to a method of manufacturing a semiconductor memory.

BACKGROUND

Manufacturing of three-dimensional (3D) laminated semiconductor memories such as a 3D-NAND flash memory includes a step of forming a hole having a high aspect ratio in a laminated film with a plurality of laminated insulation films. Recently, due to an increase in capacity of semiconductor memories, the laminated number of the insulation films is increased and the thickness of the laminated films is increased. Accordingly, it is required to form a hole having a higher aspect ratio in a laminated film. However, it is difficult to form a desired hole with a high aspect ratio.

Accordingly, there is known a technique of forming a hole in two steps in a lamination formed by forming a plurality of insulation films is (e.g., see the following patent document 1). In this technique, in a step in which a first lamination formed by forming a predetermined number of insulation films, a first hole is formed through the first lamination and is filled with a sacrificial material such as polysilicon. Further, a second lamination formed by forming a predetermined number of insulation films is additionally formed on the first lamination with the first hole filled with the sacrificial material. Further, a second hole is formed through the second lamination at a position corresponding to the first hole, and the sacrificial material filled in the first hole is removed by wet etching through the second hole. Accordingly, the first hole and the second hole can communicate with each other and a hole having a high aspect ratio can be formed.

PRIOR ART DOCUMENT

Patent Documents

Patent Document 1: Specification of U.S. Pat. No. 9,449,982

SUMMARY

According to one embodiment of the present disclosure, there is provided a method of manufacturing a semiconductor memory including: forming a first lamination on a substrate; forming a first hole through the first lamination by etching the first lamination; embedding a first sacrificial material including a thermally decomposable organic material in the first hole; forming a recess at an upper portion of the first hole by thermally decomposing a portion of the first sacrificial material by annealing the first lamination at a first temperature, or by ashing a portion of the first sacrificial material by exposing the first lamination to oxygen plasma; forming an oxide film in the recess; removing the first sacrificial material under the oxide film by decomposing the entire first sacrificial material by annealing the first lamination at a second temperature higher than the first temperature; embedding a second sacrificial material on the oxide film in the recess; forming a second lamination on the first lamination and the second sacrificial material; forming a second hole through the second lamination at a position corresponding to the first hole by etching the second lamination in an extension direction of the first hole; and removing the oxide film and the second sacrificial material.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a method of forming a hole in the related art, a sacrificial material filled in a first hole is removed by wet etching after a second hole is formed. However, the permeation path of a chemical that decomposes the sacrificial material is the second hole formed over the first hole, so the chemical has difficulty in reaching to the sacrificial material at the bottom of the first hole. Accordingly, it is difficult to sufficiently remove the sacrificial material at the bottom of the first hole.

Therefore, it is considered to increase the time of wet etching or perform etching in a higher etching rate condition to sufficiently remove the sacrificial material at the bottom of the first hole. However, in this case, there is a problem in that damage is increased at the portion of the lamination coming in contact with the chemical.

Further, since the aspect ratio of the first hole and the second hole is large, flow of the chemical is difficult to be generated in the first hole. Accordingly, even if the sacrificial material is decomposed at the bottom of the first hole, the decomposed sacrificial material does not flow to the outside of the second hole, remains in the first hole, and becomes sediment in some cases. When sediment exists in the first hole, the quality of the semiconductor memory is deteriorated.

Therefore, the present disclosure provides a technology of manufacturing a semiconductor memory, the technology being able to suppress damage to a lamination and sediment remaining in a hole when forming a hole.

[Method of Manufacturing Semiconductor Memory]

Figure 1:
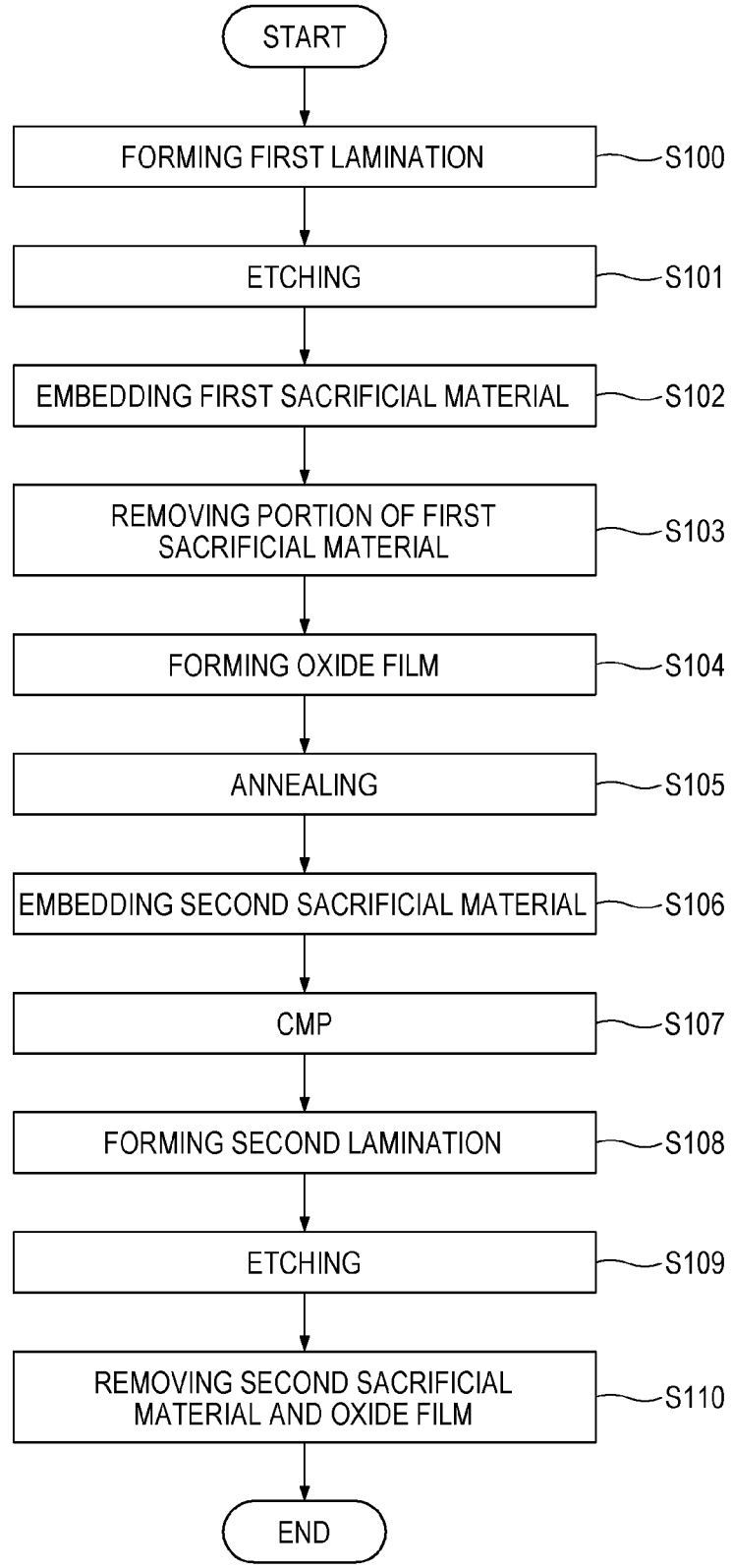
FIG. 1 is a flowchart showing an example of a method of manufacturing a semiconductor memory in an embodiment of the present disclosure.

FIG. 1 is a flowchart showing an example of a method of manufacturing a semiconductor memory in an embodiment of the present disclosure. In the flowchart shown in FIG. 1, a method of forming a hole with a large aspect ratio through a processing target that is used for a semiconductor memory such as a 3D-NAND flash memory is exemplified.

Figure 2:
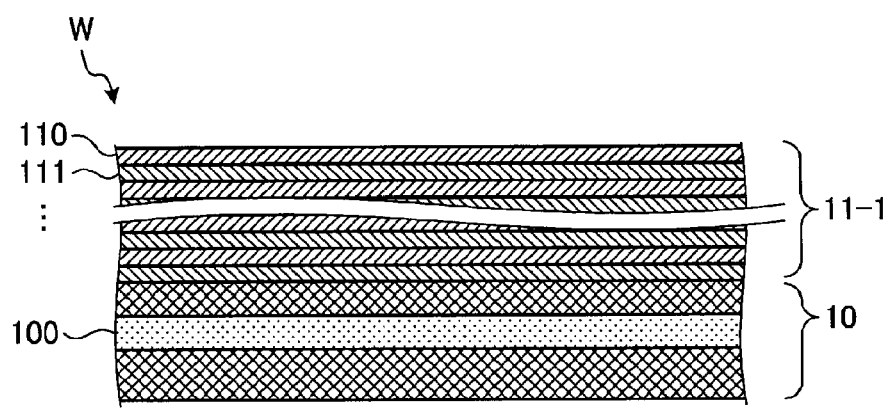
FIG. 2 is a cross-sectional view showing an example of a processing target with a first lamination formed on a substrate.

First, a first lamination is formed on a substrate using a film forming device not shown (S100). Accordingly, for example, a processing target W shown in FIG. 2 is fabricated. FIG. 2 is a cross-sectional view showing an example of the processing target W with a first lamination 11-1 formed on a substrate 10. In step S100, for example, as shown in FIG. 2, the first lamination 11-1 is formed on the substrate 10 such as a silicon substrate. Step S100 is an example of a first lamination step.

The substrate 10 includes a source diffusion layer 100. The first lamination 11-1 has a structure in which two kinds of insulation films being different in permittivity are alternately laminated several times. In detail, the first lamination 11-1, for example, as shown in FIG. 2, has a structure in which silicon oxide films 110 and silicon nitride films 111 are alternately laminated. The silicon oxide film 110 is an example of a first insulation film and the silicon nitride film 111 is an example of a second insulation film.

Figure 3:
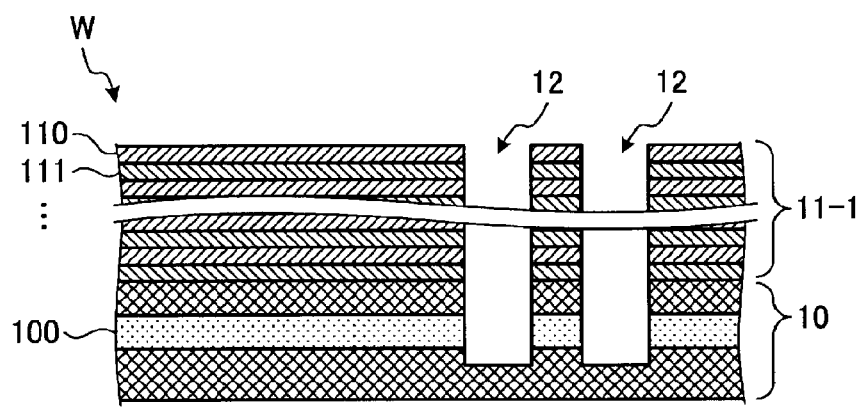
FIG. 3 is a cross-sectional view showing an example of a processing target having a first hole formed therein.

Next, the processing target W is etched using an etching device not shown, whereby, for example, as shown in FIG. 3, a first hole 12 is formed through the processing target W (S101).

FIG. 3 is a cross-sectional view showing an example of the processing target W having the first hole 12 formed therein. In step S101, the processing target W is etched, whereby, for example, as shown in FIG. 3, a plurality of first holes 12 is formed in the thickness direction of the first lamination 11-1 and the substrate 10. Step S101 is an example of a first etching step.

Figure 4:
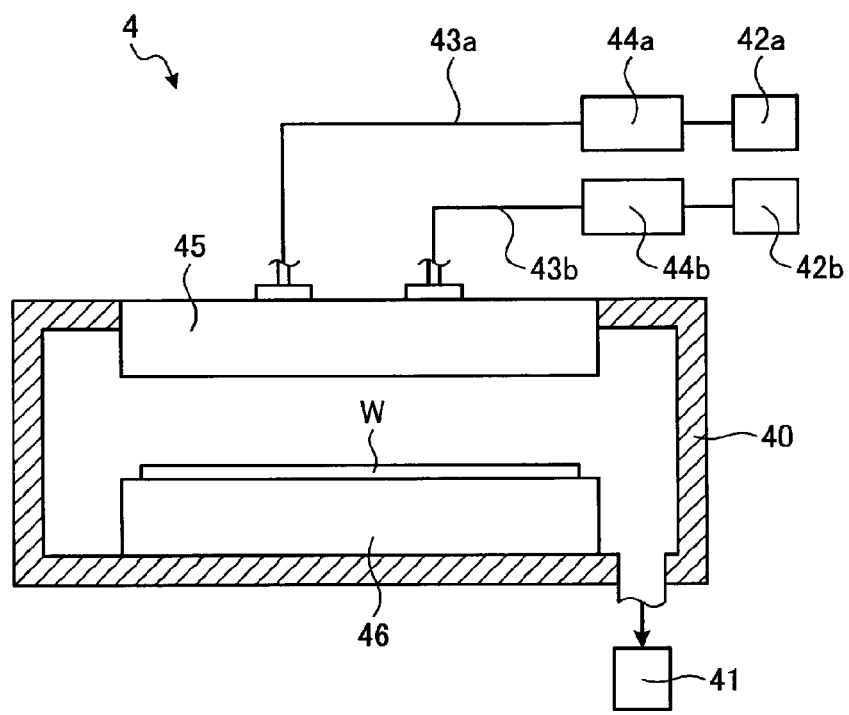
FIG. 4 is a schematic cross-sectional view showing an example of an embedding device.

Next, a first sacrificial material that is a thermally decomposable organic material is embedded in the first hole 12, for example, using an embedding device 4 shown in FIG. 4 (S102). Step S102 is an example of a first embedding step. FIG. 4 is a schematic cross-sectional view showing an example of the embedding device 4. In this embodiment, the embedding device 4 is, for example, a Chemical Vapor Deposition (CVD) device.

The embedding device 4 has a container 40 and an exhaust device 41. The exhaust device 41 discharges gas in the container 40. A predetermined vacuum atmosphere is created in the container 40 by the exhaust device 41.

A raw material supply source 42a, which accommodates isocyanate that is an example of a raw material monomer in a liquid state, is connected to the container 40 through a supply pipe 43a. Further, a raw material supply source 42b, which accommodates amine that is an example of a raw material monomer in a liquid state, is connected to the container 40 through a supply pipe 43b. The isocyanate and amine include an organic material and are examples of a plurality of kinds of monomers for producing the first sacrificial material that can be thermally decomposed.

The liquid of isocyanate supplied from the raw material supply source 42a is evaporated by an evaporator 44a disposed in the supply pipe 43a. Further, isocyanate vapor is introduced into a shower head 45 that is a gas discharge part through the supply pipe 43a. Further, the liquid of amine supplied from the raw material supply source 42b is evaporated by an evaporator 44b disposed in the supply pipe 43b. Further, amine vapor is introduced into the shower head 45.

The shower head 45 is, for example, disposed at the upper portion of the container 40 and has several discharge ports on the bottom. The shower head 45 discharges the isocyanate vapor introduced through the supply pipe 43a and the amine vapor introduced through the supply pipe 43b into the container 40 through the respective discharge ports in a shower shape.

A loading bed 46 having a temperature adjuster not shown is disposed in the container 40. The processing target W is loaded onto the loading bed 46. The temperature adjuster in the loading bed 46 controls the temperature of the processing target W such that the temperature of the processing target W becomes a predetermined temperature. The temperature adjuster in the loading bed 46 controls the temperature of the processing target W such that the temperature of the processing target W becomes a temperature that is suitable for vapor deposition polymerization of the raw material monomers respectively supplied from the raw material supply source 42a and the raw material supply source 42b. The temperature suitable for vapor deposition polymerization is determined in accordance with the kinds of the raw material monomers. In this embodiment, the loading bed 46 controls the temperature of the processing target W to be 40 degrees C. to 150 degrees C. for example. As an example, the loading bed 46 controls the processing target W to be 80 degrees C. for example.

Figure 5:
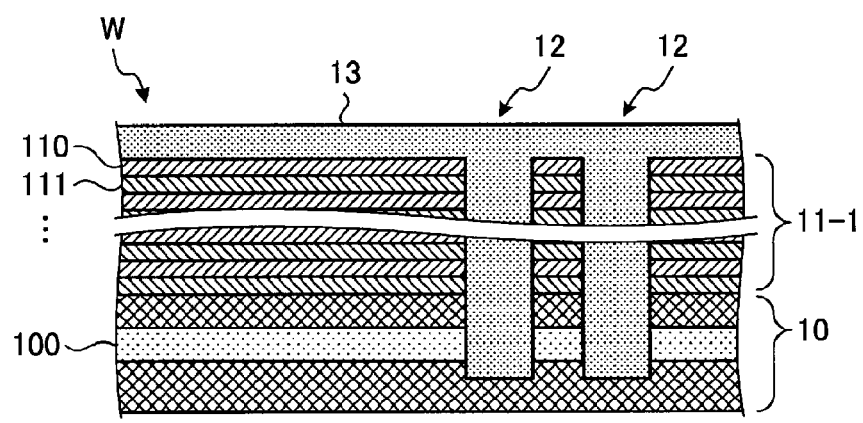
FIG. 5 is a cross-sectional view showing an example of the processing target with a first sacrificial material embedded in the first hole.

A vapor deposition polymerization reaction of two kinds of raw material monomers is generated on the surface of the processing target W using the embedding device 4 described above, whereby, for example, as shown in FIG. 5, it is possible to embed a first sacrificial material of a polymer 13 in the first hole 12 of the processing target W. FIG. 5 is a cross-sectional view showing an example of the processing target W with the first sacrificial material 13 embedded in the first hole 12. In this embodiment, the first sacrificial material 13 is, for example, a polymer having a urea bond. When the two kinds of raw material monomers are, for example, isocyanate and amine, the first sacrificial material 13 is, for example, polyurea. Further, a side of the first hole 12 formed through the processing target W, that is, a side of the plurality of silicon oxide films 110 and the silicon nitride films 111 alternately laminated may be protected by a sacrificial liner film of polysilicon (Poly-Si), a titanium nitride (TiN) and so on.

Figure 6A:
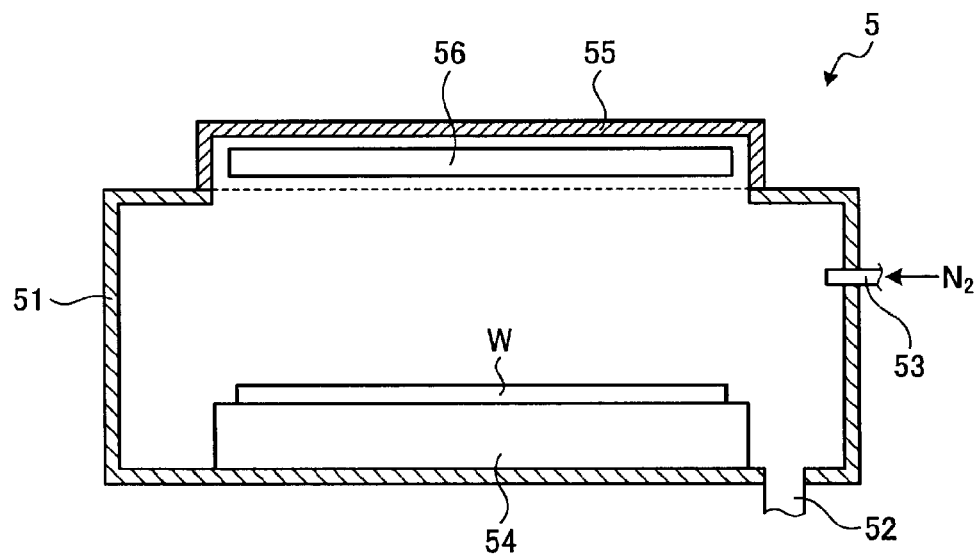
FIG. 6A is a schematic cross-sectional view showing an example of an annealing device.

Next, the processing target W with the first sacrificial material 13 embedded in the first hole 12 is, for example, put into an annealing device 5 shown in FIG. 6A and a portion of the first sacrificial material 13 is removed (S103). In this embodiment, a portion of the first sacrificial material 13 is removed, for example, by annealing. FIG. 6A is a schematic cross-sectional view showing an example of the annealing device 5. The annealing device 5 has a container 51 and an exhaust pipe 52. An inert gas is supplied into the container 51 through the supply pipe 53. In this embodiment, the inert gas is, for example, nitrogen ($N_2$). The gas in the container 51 is discharged from the exhaust pipe 52. In this embodiment, the inside of the container 51 is in an ordinary pressure atmosphere, but as another example, the inside of the container 51 may be in a vacuum atmosphere.

A loading bed 54 on which the processing target W is loaded is disposed in the container 51. A lamp house 55 is disposed at a position facing the surface of the loading bed 54 on which the processing target W is loaded. An infrared lamp 56 is disposed in the lamp house 55.

An inert gas is supplied into the container 51 with the processing target W loaded on the loading bed 54. Further, the processing target W is heated by turning on the infrared lamp 56. When the temperature of the first sacrificial material 13 embedded in the first hole 12 of the processing target W becomes a temperature that causes depolymerization reaction, the first sacrificial material 13 is depolymerized by the two kinds of monomers. In this embodiment, since the first sacrificial material 13 is polyurea, the first sacrificial material 13 is depolymerized into isocyanate and amine that are raw material monomers by heating the processing target W at 250 degrees C. or higher. The higher the temperature, the more the depolymerization quickly progresses. Further, the first sacrificial material 13 may be urethane.

In step S103, the processing target W is heated such that the temperature thereof becomes a first temperature by the annealing device 5. The first temperature, for example, pertains to a range higher than or equal to 250 degrees C. and 300 degrees C. or lower. In this embodiment, the processing target W is heated such that the temperature, for example, becomes 260 degrees C. Heating by step S103 is performed, for example, tens of minutes. Accordingly, a portion of the first sacrificial material 13 is removed from each first hole 12.

Figure 6B:
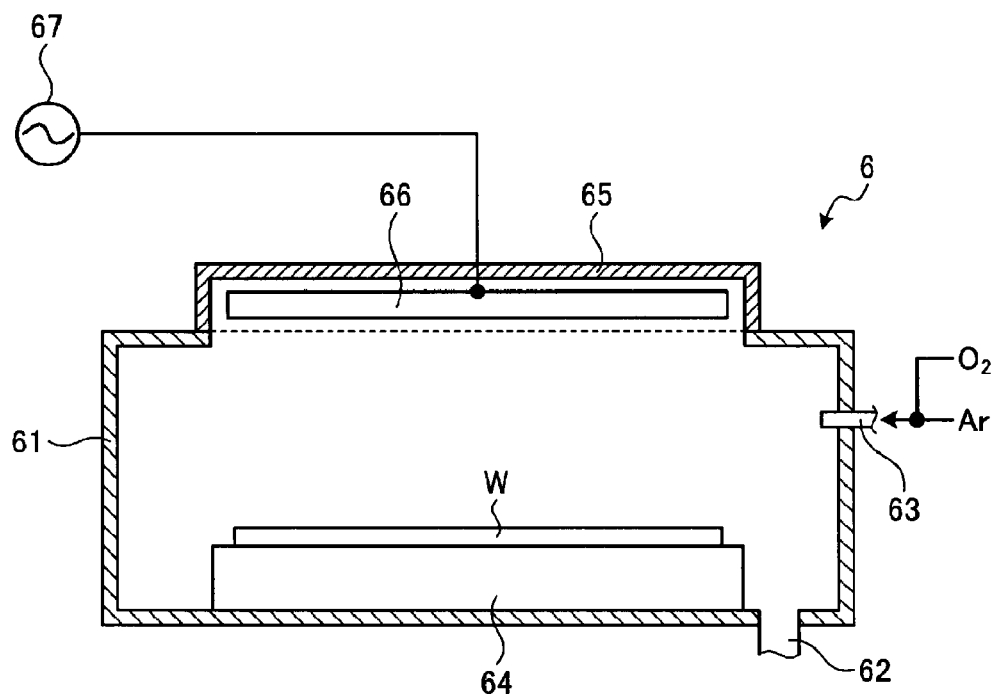
FIG. 6B is a schematic cross-sectional view showing an example of an ashing device.

Further, removal of a portion of the first sacrificial material 13 in step S103 may be performed, for example, by ashing by an ashing device 6 shown in FIG. 6B. FIG. 6B is a schematic cross-sectional view showing an example of the ashing device 6. The ashing device 6 has a container 61 and an exhaust pipe 62. Ar gas or oxygen ($O_2$) gas is supplied into the container 61 through the supply pipe 63. The gas in the container 61 is discharged from the exhaust pipe 62. In this embodiment, the inside of the container 61 is in an ordinary pressure atmosphere, but as another example, the inside of the container 61 may be in a vacuum atmosphere.

A lower electrode 64 is disposed in the container 61 and the processing target W is loaded on the lower electrode 64. A housing 65 is disposed at a position facing the surface of the lower electrode 64 on which the processing target W is loaded. An upper electrode 66 is disposed in the housing 55. A high-frequency power supply 67 is connected to the upper electrode 66.

After the processing target W is loaded on the lower electrode 64, Ar gas is supplied into the container 61. Further, when high-frequency power having a predetermined frequency is applied to the upper electrode 66 from the high-frequency power supply 67, plasma of the Ar gas in the container 61 is excited. After the plasma of the Ar gas is excited, $O_2$ gas is additionally supplied into the container 61, whereby the first sacrificial material 13 embedded in each of the first holes 12 of the processing target W is ashed (carbonized) and accordingly a portion of the first sacrificial material 13 is removed from each of the first holes 12.

Figure 7:
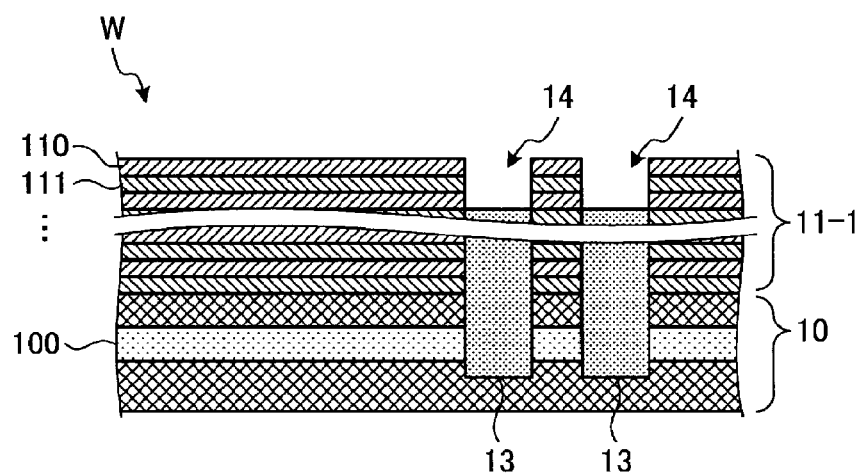
FIG. 7 is a cross-sectional view showing an example of the processing target with the first sacrificial material partially removed.

The processing in step S103 is performed, whereby the processing target W, for example, becomes the state shown in FIG. 7. FIG. 7 is a cross-sectional view showing an example of the processing target W with the first sacrificial material 13 partially removed. For example, as shown in FIG. 7, the upper portion of the first sacrificial material 13 is removed by depolymerization, whereby a recess 14 is formed in the first hole 12. Step S103 is an example of a recess forming step. When the first sacrificial material 13 is polyurea, depolymerization slowly progresses at a temperature belonging to a range of higher than or equal to 250 degrees C. and 300 degrees C. or lower, as compared with when it is heated at 300 degrees C. or higher. Accordingly, it is possible to adjust the depth of the recess 14 with high precision by adjusting the heating time. The depth of the recess 14 is, for example, 50 to 200 nm. In this embodiment, the depth of the recess 14 is, for example, 50 nm.

Figure 8:
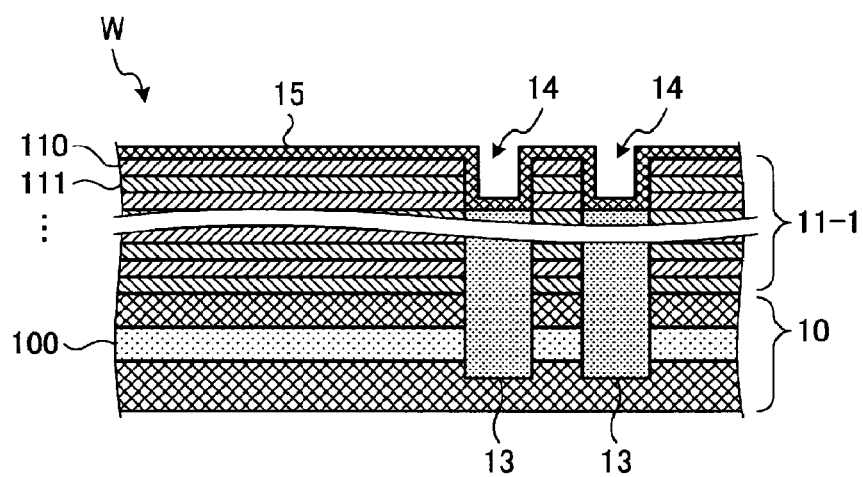
FIG. 8 is a cross-sectional view showing an example of the processing target with an oxidation film formed.

Next, the processing target W with the recess 14 formed in the first hole 12 is put into a film forming device not shown, and for example, as shown in FIG. 8, an oxide film 15 is formed in the processing target W (S104). FIG. 8 is a cross-sectional view showing an example of the processing target W with the oxide film 15 formed thereon. Step S104 is an example of a second lamination step. The oxide film 15 is formed on the processing target W, for example, by Atomic Layer Deposition (ALD). In this embodiment, the oxide film 15 is a Low Temperature Oxide (LTO) composed of $SiO_2$, and is a hollow film in comparison to a thermal oxide film formed at a high temperature. The oxide film 15 is formed, for example, up to thickness of 3 nm to 5 nm. In this embodiment, the depth of the oxide film 15 is, for example, 3 nm.

Figure 9:
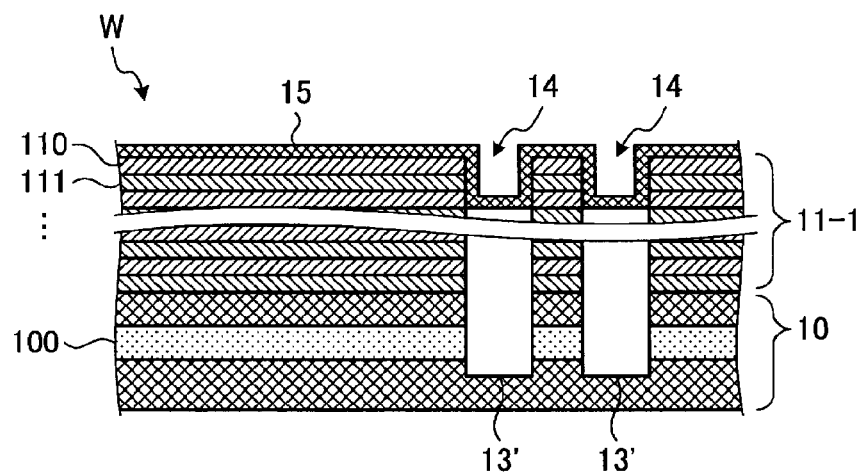
FIG. 9 is a cross-sectional view showing an example of the processing target with the first sacrificial material removed.

Next, the processing target W with the oxide film 15 formed thereon is put back into the annealing device 5 shown in FIG. 6A and annealed (S105). In step S105, the processing target W is heated such that the temperature thereof becomes a second temperature by the annealing device 5. The second temperature, for example, belongs to a range of 300 degrees C. or higher. In this embodiment, the processing target W is heated such that the temperature, for example, becomes 400 degrees C. Heating by step S105 is performed, for example, several minutes. Accordingly, the entire first sacrificial material 13 in the first hole 12 is depolymerized. Depolymerization is an example of thermal decomposition. Further, isocyanate and amine produced by depolymerization passes through the oxide film 15 that is a hollow film, thereby being separated from the first hole 12 under the oxide film 15. Accordingly, the first sacrificial material 13 is removed from the first hole 12 under the oxide film 15, and for example, as shown in FIG. 9, a cavity 13' is created in the first hole 12 under the oxide film 15. FIG. 9 is a cross-sectional view showing an example of the processing target W with the first sacrificial material 13 removed. Step S105 is an example of a first removing step.

Figure 10:
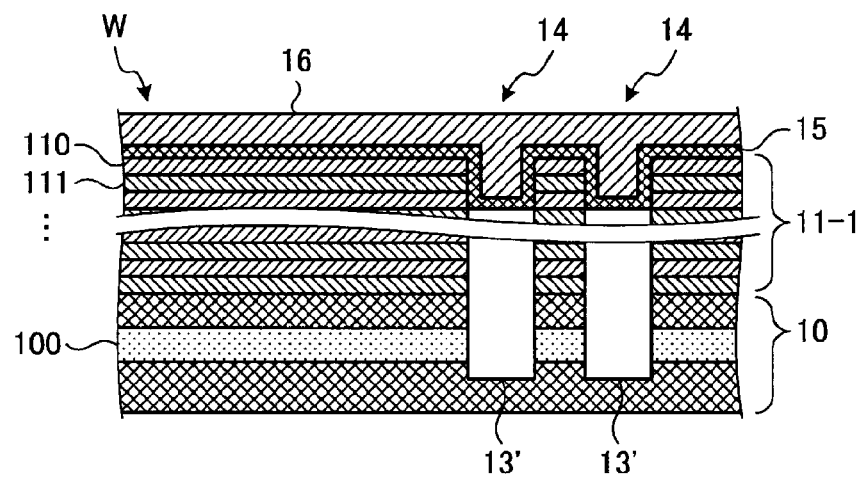
FIG. 10 is a cross-sectional view showing an example of the processing target with a second sacrificial material embedded in a recess.

Next, the processing target W with the first sacrificial material 13 removed is put into a film forming device not shown, and for example, as shown in FIG. 10, a second sacrificial material 16 is embedded in the recess 14 of the processing target W (S106). FIG. 10 is a cross-sectional view showing an example of the processing target W with the second sacrificial material 16 embedded in the recess 14. Accordingly, the second sacrificial material 16 is embedded in the recess 14 formed in the first hole 12. Step S106 is an example of a second embedding step. The second sacrificial material 16 is embedded in the recess 14, for example, by ALD. In this embodiment, the second sacrificial material 16 may be polysilicon, tungsten, an aluminum oxide (AlO), an aluminum nitride (AlN) and so on.

Figure 11:
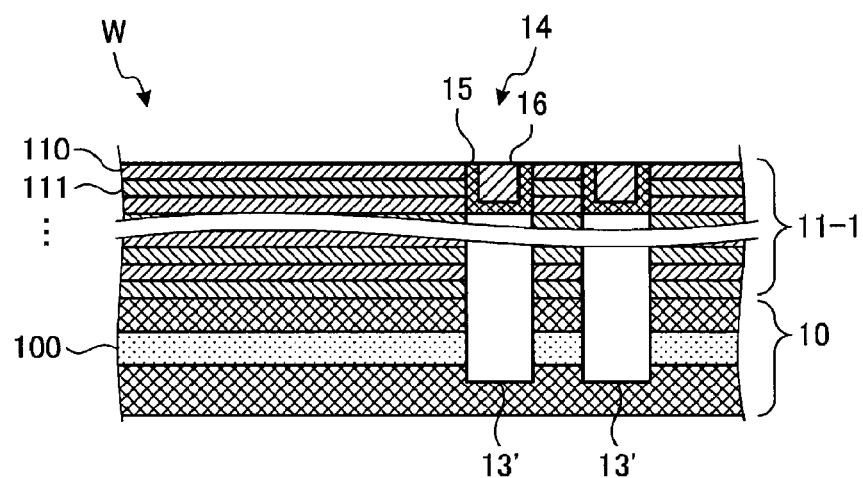
FIG. 11 is a cross-sectional view showing an example of the processing target with the top surface of the first lamination polished by Chemical Mechanical Polishing (CMP).

Next, the top surface of the first lamination 11-1 is polished by Chemical Mechanical Polishing (CMP) (S107). Accordingly, for example, as shown in FIG. 11, the oxide film 15 and the second sacrificial material 16 formed on the top surface of the processing target W are removed. FIG. 11 is a view showing an example of the processing target W with the top surface of the first lamination 11-1 polished by CMP. However, the oxide film 15 and the second sacrificial material 16 remain at the upper portion of the first hole 12. The thickness of the second sacrificial material 16 remaining at the upper portion of the first hole 12 is a thickness obtained by subtracting the thickness of the oxide film 15 from the depth of the recess 14. When the depth of the recess 14 is, for example, 50 nm and the thickness of the oxide film 15 is, for example, 3 nm, the thickness of the second sacrificial material 16 remaining at the upper portion of the first hole 12 is, for example, 47 nm.

Figure 12:
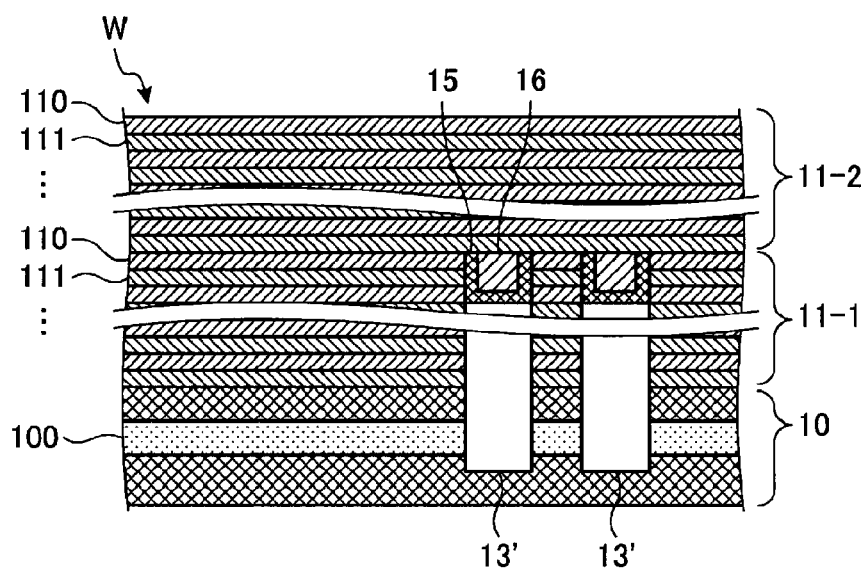
FIG. 12 is a cross-sectional view showing an example of the processing target with the second lamination formed on the first lamination.

Next, the processing target W with the top surface polished is put into the film forming device not shown, and for example, as shown in FIG. 12, a second lamination 11-2 is formed on the first lamination 11-1 (S108). FIG. 12 is a cross-sectional view showing an example of the processing target W with the second lamination 11-2 formed on the first lamination 11-1. The second lamination 11-2, similar to the first lamination 11-1, has a structure in which two kinds of insulation films being different in permittivity are alternately laminated several times. In detail, the second lamination 11-2, for example, as shown in FIG. 12, has a structure in which silicon oxide films 110 and silicon nitride films 111 are alternately laminated. Step S108 is an example of a third lamination step.

For example, as shown in FIG. 12, since the oxide film 15 and the second sacrificial material 16 exist at the upper portion of the cavity 13' of the first lamination 11-1, the cavity 13' is prevented from being filled with the second lamination 11-2 when the second lamination 11-2 is formed. Accordingly, it is possible to laminate the second lamination 11-2 on the first lamination 11-1 while maintaining the cavity 13' in the first lamination 11-1.

Figure 13:
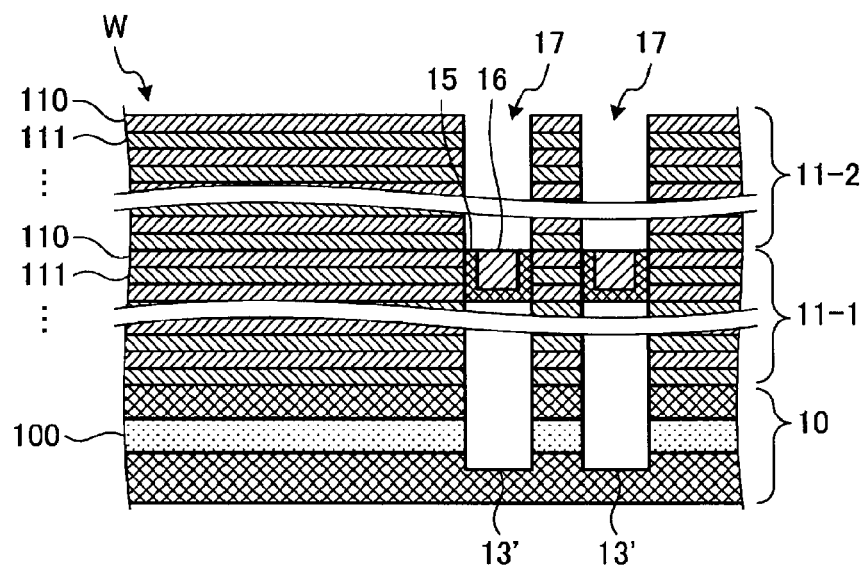
FIG. 13 is a cross-sectional view showing an example of the processing target having a first hole formed through the second lamination.

Next, the second lamination 11-2 is etched in the extension direction of the first hole 12 using an etching device not shown, whereby a second hole 17 is formed through the second lamination 11-2 at a position corresponding to the first hole 12 (S109). Accordingly, for example, as shown in FIG. 13, the second hole 17 is formed through the second lamination 11-2. FIG. 13 is a cross-sectional view showing an example of the processing target W having the second hole 17 formed therein. Step S109 is an example of a second etching step.

The oxide film 15 and the second sacrificial material 16 over the cavity 13' function as a stopper of etching. That is, since the oxide film 15 and the second sacrificial material 16 exist over the cavity 13', excessive etching of the side or the bottom of the cavity 13' when the second hole 17 is formed is prevented.

Figure 14:
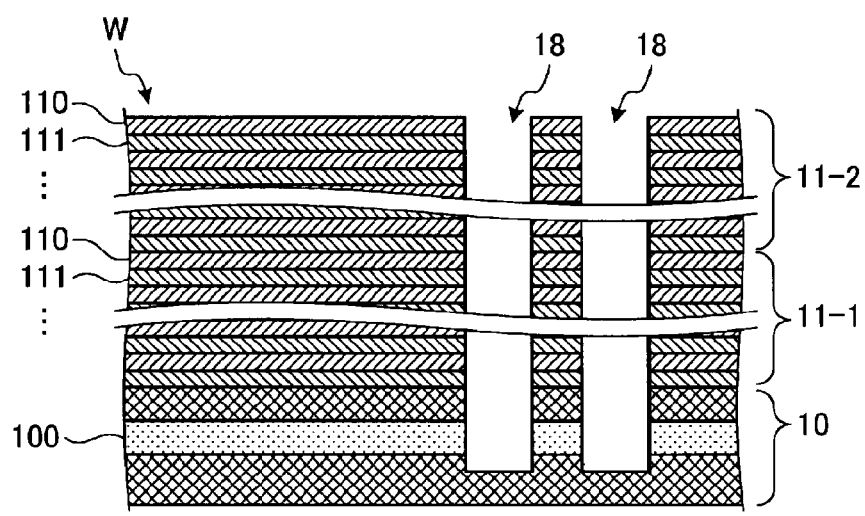
FIG. 14 is a cross-sectional view showing an example of the processing target with the oxidation film and the second sacrificial material removed.

Next, the oxide film 15 and the second sacrificial material 16 are removed from the processing target W with the second hole 17 formed therein (S110). Step S110 is an example of a second removing step. The oxide film 15 and the second sacrificial material 16 are removed, for example, by wet etching. Since the oxide film 15 and the second sacrificial material 16 are removed, for example, as shown in FIG. 14, the first hole 12 of the first lamination 11-1 and the second hole 17 of the second lamination 11-2 communicate with each other. Accordingly, a hole 18 having an aspect ratio larger than those of the first hole 12 and the second hole 17 is formed at the processing target W. FIG. 14 is a cross-sectional view showing an example of the processing target W with the oxide film 15 and the second sacrifice material 16 removed. A predetermined step is additionally performed on the processing target W shown in FIG. 14, whereby a semiconductor memory such as a 3D-NAND flash memory is manufactured.

A method of manufacturing a semiconductor memory in a first embodiment was described above. A method of manufacturing a semiconductor memory in this embodiment includes a first lamination step, a first etching step, a first embedding step, a recess forming step, a second lamination step, a first removing step, a second embedding step, a third lamination step, a second etching step, and a second removing step. In the first lamination step, a first lamination is formed on a substrate. In the first etching step, a first hole 12 is formed at the first lamination 11-1 by etching the first lamination 11-1. In the first embedding step, a first sacrificial material 13 including an thermally decomposable organic material is embedded in the first hole 12. In the recess forming step, a portion of the first sacrificial material 13 is thermally decomposed by annealing the first lamination 11-1 at a first temperature or a portion of the first sacrificial material 13 is ashed by exposing the first lamination 11-1 to oxygen plasma, whereby a recess 14 is formed at the upper portion of the first hole 12. In the second lamination step, an oxide film 15 is formed in the recess 14. In the first removing step, the first lamination 11-1 is annealed at a second temperature higher than the first temperature, whereby the entire first sacrificial material 13 is thermally removed, so the first sacrificial material 13 under the oxide film 15 is removed through the oxide film 15. In the second embedding step, a second sacrificial material 16 is embedded on the oxide film 15 in the first hole 12. In the third lamination step, a second lamination 11-2 is formed on the first lamination 11-1 and the second sacrificial material 16. In the second etching step, the second lamination 11-2 is etched in the extension direction of the first hole 12, whereby a second hole 17 is formed through the second lamination 11-2 at a position corresponding to the first hole 12. In the second removing step, the oxide film 15 and the second sacrificial material 16 are removed. Accordingly, damage to the first lamination 11-1 and the second lamination 11-2 and sediment remaining in a hole 18 when the hole 18 is formed at the processing target W can be suppressed.

Further, in the above embodiment, the first sacrificial material 13 is a polymer having a urea bond produced by polymerization of a plurality of kinds of monomers. Accordingly, it is possible to easily produce the first sacrificial material 13 and easily remove the first sacrificial material 13 by applying heat.

Further, in the above embodiment, the first temperature belongs to a range higher than or equal to 250 degrees C. and lower than 300 degrees C. and the second temperature belongs to a range of 300 degrees C. or higher. Since the first temperature belongs to the range higher than or equal to 250 degrees C. and lower than 300 degrees C., it is possible to easily adjust the depth of the recess 14 that is formed at the upper portion of the first hole 12. Further, since the second temperature belongs to the range of 300 degrees C. or higher, it is possible to remove the first sacrificial material 13 in the first hole 12 without sediment.

Further, in the above embodiment, the first lamination 11-1 and the second lamination 11-2 have a structure in which first insulation films and second insulation films that are different in permittivity are alternately laminated. Further, the first insulation film is, for example, a silicon oxide film 110 and the second insulation film is, for example, a silicon nitride film 111. Accordingly, it is possible to manufacture a semiconductor memory such as a 3D-NAND flash memory.

[Others]

Further, the technology disclosed herein is not limited to the above embodiment and may be changed in various ways within the spirit thereof.

For example, in the above embodiment, the first hole 12 is formed through the first lamination 11-1 and the second hole 17 is formed through the second lamination 11-2, and then the first hole 12 and the second hole 17 are connected. Accordingly, the hole 18 having an aspect ratio larger than those of the first hole 12 and the second hole 17 is formed in the processing target W. However, the disclosed technology is not limited thereto. For example, the processing of step S102 to step S110 may be additionally performed by considering the first lamination 11-1 and the second lamination 11-2, in which the hole 18 is formed, as a first lamination 11-1. Further, the processing of step S102 to step S110 may be repeated two times or more. Accordingly, the hole 18 having a certain aspect ratio can be formed in the processing target W.

Further, in the above embodiment, polyurea was used as the first sacrificial material 13, but other organic materials may be used as long as they can be thermally decomposed. As thermally decomposable organic materials, other than polyurea, polyurethane, polyolefin, polycarbonate, polyamide, phenol resin, a small molecular material and so on that can be thermally evaporated may be considered. Further, the thermally decomposable organic material may be embedded in each of the first holes 12 of the processing target W.

Further, in the above embodiment, etching of multi-layered film that is used for a semiconductor memory was described as an example, the disclosed technology is not limited thereto. For example, even in etching of a single-layered film, the disclosed technology can be applied as long as it is a field requiring a hole or a trench having a large aspect ratio.

Further, in the above embodiment, after the oxide film 15 is formed, the first sacrificial material 13 in the first hole 12 is removed by annealing in step S105, but the disclosed technology is not limited thereto. For example, the second hole 17 is formed through the second lamination 11-2 and the oxide film 15 and the second sacrificial material 16 are removed through the second hole 17 by wet etching, and then the first sacrificial material 13 may be removed by annealing the processing target W. Accordingly, it is possible to prevent the oxide film 15 and the second sacrificial material 16 from dropping into cavity 13' when the second lamination 11-2 is formed or the second hole 17 is formed through the second lamination 11-2. Accordingly, even after the second hole 17 is formed through the second lamination 11-2, the oxide film 15 and the second sacrificial material 16 remain at the upper portion of the first hole 12. Accordingly, it is possible to easily remove the oxide film 15 and the second sacrificial material 16 through the second hole 17 by applying wet etching.

Further, in the above embodiment, the first sacrificial material 13 is embedded in the first hole 12 and then the oxide film 15 is formed on the first sacrificial material 13, but the disclosed technology is not limited thereto. For example, after the first sacrificial material 13 is embedded in the first hole 12, the first sacrificial material 13 of the top surface of the first lamination 11-1 may be removed by CMP, and then the second lamination 11-2 may be formed on the first lamination 11-1. Further, after the second hole 17 is formed through the second lamination 11-2 and the first sacrificial material 13 in the first hole 12 is removed by annealing the processing target W, for example, at 400 degrees C., whereby the first hole 12 and the second hole 17 may be connected.

According to various aspects and embodiments of the present disclosure, it is possible to suppress damage to a lamination and sediment in a hole when forming a hole through the lamination.

Further, the embodiment disclosed herein should be construed as examples, not limiting in all terms. Actually, the above embodiments may be implemented in various ways. Further, the above embodiment may be omitted, replaced, and changed in various ways without departing from the accompanying claims and the subject thereof.

What is claimed is:

1. A method of manufacturing a semiconductor memory, the method comprising:
    forming a first lamination on a substrate;
    forming a first hole through the first lamination by etching the first lamination;
    embedding a first sacrificial material including a thermally decomposable organic material in the first hole;
    forming a recess at an upper portion of the first hole by thermally decomposing a portion of the first sacrificial material by annealing the first lamination at a first temperature;
    forming an oxide film in the recess;
    removing the first sacrificial material under the oxide film by decomposing the entire first sacrificial material by annealing the first lamination at a second temperature higher than the first temperature;
    embedding a second sacrificial material on the oxide film in the recess;
    forming a second lamination on the first lamination and the second sacrificial material;
    forming a second hole through the second lamination at a position corresponding to the first hole by etching the second lamination in an extension direction of the first hole; and
    removing the oxide film and the second sacrificial material.

2. The method of claim 1, wherein the first sacrificial material comprises a polymer having a urea bond produced by polymerization of a plurality of kinds of monomers.

3. The method of claim 2, wherein the first temperature is higher than or equal to 250 degrees C. and lower than 300 degrees C., and the second temperature is higher than or equal to 300 degrees C.

4. The method of claim 3, wherein the first lamination and the second lamination include a structure in which a plurality of first insulation films and a plurality of second insulation films are alternately laminated, the first insulation films and the second insulation films having different permittivity.

5. The method of claim 4, wherein the first insulation films comprise silicon oxide films, and the second insulation films comprise silicon nitride films.

6. The method of claim 1, wherein the first lamination and the second lamination include a structure in which a plurality of first insulation films and a plurality of second insulation films are alternately laminated, the first insulation films and the second insulation films having different permittivity.

* * * * *